United States Patent
Lee et al.

(10) Patent No.: US 7,684,510 B2
(45) Date of Patent: Mar. 23, 2010

(54) APPARATUS AND METHOD FOR TRANSMISSION WHICH ENCODING A MESSAGE WITH SPACE-TIME TUBO CODE USING FEEDBACK BIT IN MOBILE COMMUNICATION SYSTEM

(75) Inventors: Jae Hong Lee, Seoul (KR); Chi Hoon Yoo, Anyang-si (KR)

(73) Assignee: Seoul National University Industry Foundation, Gwanak-Gu (KR)

( * ) Notice: Subject to any disclaimer, the term of this patent is extended or adjusted under 35 U.S.C. 154(b) by 951 days.

(21) Appl. No.: 11/368,609

(22) Filed: Mar. 7, 2006

(65) Prior Publication Data

US 2006/0212774 A1    Sep. 21, 2006

(30) Foreign Application Priority Data

Mar. 8, 2005    (KR) .................... 10-2005-0019227

(51) Int. Cl.
*H04L 7/02*    (2006.01)
(52) U.S. Cl. .................................................... 375/267
(58) Field of Classification Search ................ 375/261, 375/267, 299; 455/101, 103, 562.1
See application file for complete search history.

(56) References Cited

U.S. PATENT DOCUMENTS

| | | | | |
|---|---|---|---|---|
| 7,103,326 | B2 * | 9/2006 | Wu et al. | 375/299 |
| 7,379,506 | B2 * | 5/2008 | Boariu et al. | 375/267 |
| 2005/0048940 | A1 * | 3/2005 | Wu et al. | 455/101 |
| 2005/0064908 | A1 * | 3/2005 | Boariu et al. | 455/562.1 |
| 2005/0272432 | A1 * | 12/2005 | Ji et al. | 455/449 |
| 2006/0077076 | A1 * | 4/2006 | Hoshino et al. | 341/50 |

FOREIGN PATENT DOCUMENTS

KR    2003-0038289    5/2003
WO    WO 2004/054131 A1    6/2004

OTHER PUBLICATIONS

Larsson, E. "On the Performance of Orthogonal Space-Time Block Coding With Quantized Feedback" IEEE Communications Letters, Nov. 2002, vol. 6, No. 11, pp. 487-489.
Ganesan, G. "Diagonally Weighted Orthogonal Space-Time Block Codes" Proc. Asilomar Conference on Signals, Systems, and Computers, Nov. 2002, pp. 1147-1151.
Su, H. "Space-Time Turbo Codes with Full Antenna Diversity" IEEE Transactions on Communications, Jan. 2001, vol. 49, No. 1, pp. 47-57.
Liu, Y. "Full Rate Space-Time Turbo Codes" IEEE Journal on Selected Areas in Communications, May 2001, vol. 19, No. 5, pp. 969-980.
Tarokh, V. "Space-Time Codes for High Data Rate Wireless Communication: Performance Criterion and Code Construction" IEEE Transactions on Information Theory, Mar. 1998, vol. 44, No. 2, pp. 744-765.
Kim, T. "Improved Space-Time Turbo Codes with Full Spatial Diversity over Integer Ring" Proc. IEEE 57th Vehicular Technology Conference, Apr. 2003, pp. 727-731.

* cited by examiner

*Primary Examiner*—Betsy L Deppe
(74) *Attorney, Agent, or Firm*—McDermott Will & Emery LLP

(57) ABSTRACT

An apparatus and a method for transmission encoding a message with space-time turbo code using feedback information of the channel gain or the phase in digital mobile communication system having a plurality of transmit antennas are disclosed.

8 Claims, 6 Drawing Sheets

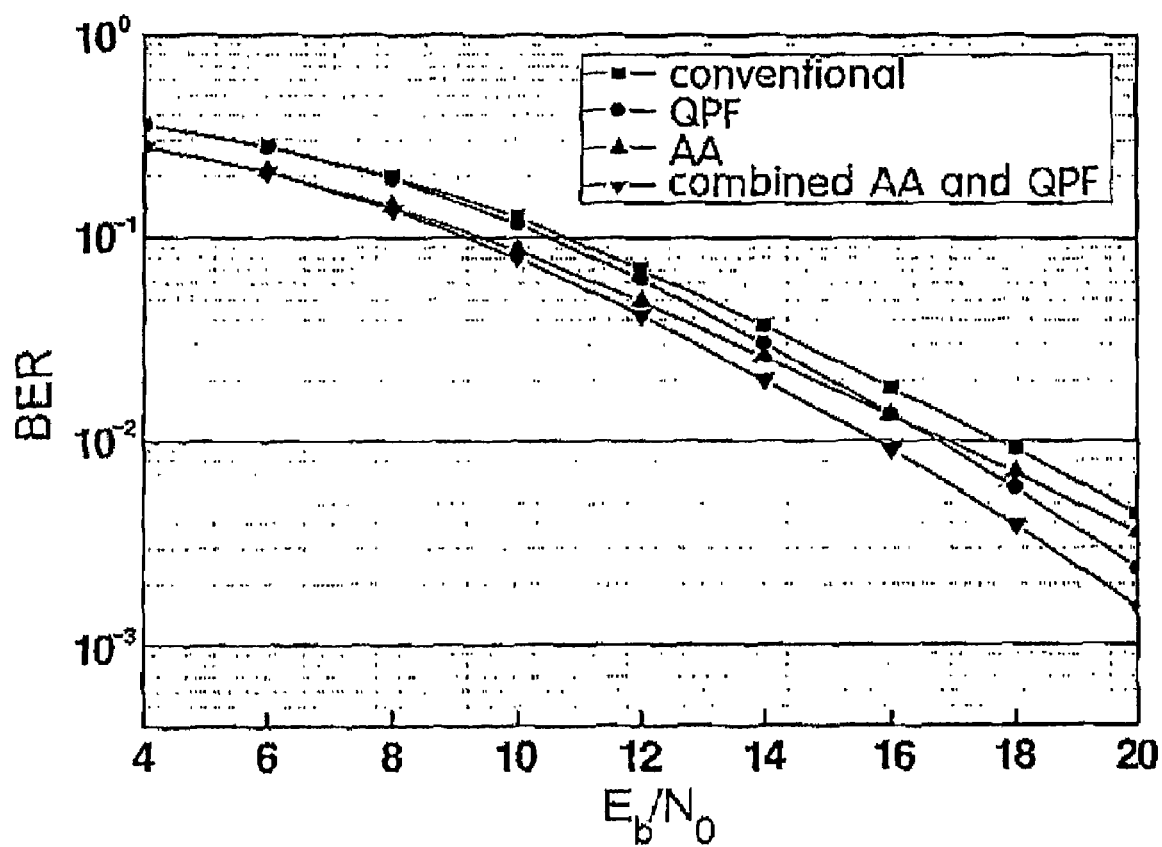

APPARATUS AND METHOD FOR TRANSMISSION WHICH ENCODING A MESSAGE WITH SPACE-TIME TUBO CODE USING FEEDBACK BIT IN MOBILE COMMUNICATION SYSTEM

CROSS-REFERENCE TO RELATED APPLICATIONS

This application claims priority to and the benefit of Korean Patent Application No. 10-2005-0019227, filed Mar. 8, 2005, the contents of which are hereby incorporated herein by reference in their entirety.

BACKGROUND OF THE INVENTION

1. Field of the Invention

The present invention relates to an apparatus and a method for transmission which encoding a message with space-time turbo code using feedback information of the channel gain or the phase in digital mobile communication system having a plurality of transmit antennas.

2. Description of the Related Art

Recently, the space-time turbo code, a combination of the space-time code and the turbo code, has been widely studied. The space-time turbo code provides the robust error correcting performance over the various time-varying channels as it has both the spatial diversity gain of the space-time code and the powerful coding gain of the turbo code.

In the most researches for the space-time turbo code, assume that the transmitter does not know the Channel State Information (CSI). If the transmitter has knowledge of the CSI by using a proper feedback scheme, the performance of the space-time turbo code can be improved. The diagonal weighting scheme with quantized feedback information has been proposed for the space-time block code to improve its performance. However, the diagonal weighting scheme is not applicable for the space-time turbo code as it does not distinguish between the systematic bits and parity bits.

SUMMARY OF THE INVENTION

The present invention provides feedback schemes which can improve the performance of a space-time turbo code with a plurality of transmit antennas by using the quantized feedback. One is an antenna altering (AA) scheme in which the systematic bits are always transmitted through the antenna with larger channel gain. The other is a quantized phase feedback (QPF) scheme which rotates the signal constellation according to the feedback information of the channel phase.

The space-time turbo code using the feedback scheme of the present invention has better performance than that of the conventional invention.

The purpose of the present invention provides an apparatus and a method for transmission encoding a message with space-time turbo code using feedback information of the channel gain or the phase in digital mobile communication system having a plurality of transmit antennas.

A method for transmission encoding a message with space-time turbo code in digital mobile communication system having a plurality of transmit antennas, comprising: encoding the message for communication with space-time turbo code and generating a systematic bit and a punctured parity bit; receiving a feedback bit reflecting information of the channel gain of the plurality of transmit antennas from receive antenna; selecting a transmit antenna with the largest channel gain of the plurality of transmit antennas according to the feedback bit; and transmitting the systematic bit through the selected transmit antenna and the punctured parity bit through one of the other antennas.

In another embodiment, a method for transmission encoding a message with space-time turbo code in digital mobile communication system having a plurality of transmit antennas, comprising: encoding the message for communication with space-time turbo code and generating a systematic bit and a punctured parity bit; receiving a feedback bit reflecting phase difference information of the channel gain of the plurality of transmit antennas from receive antenna; and rotating a constellation corresponding to the systematic bit and the punctured parity bit respectively so that phase difference of the channel gain according to a feedback bit would be at its largest.

BRIEF DESCRIPTION OF THE DRAWINGS

The accompanying drawings, together with the specification, illustrate certain exemplary embodiments of the present invention and serve to explain the principles of the present invention.

FIG. 10 is a graph illustrating a performance of the QPSK space-time turbo codes with feedback scheme in accordance with an exemplary embodiment of the present invention in a quasi-static Rayleigh fading.

DETAILED DESCRIPTION

The present invention will now be described more fully hereinafter with reference to the accompanying drawings.

Figure 1:
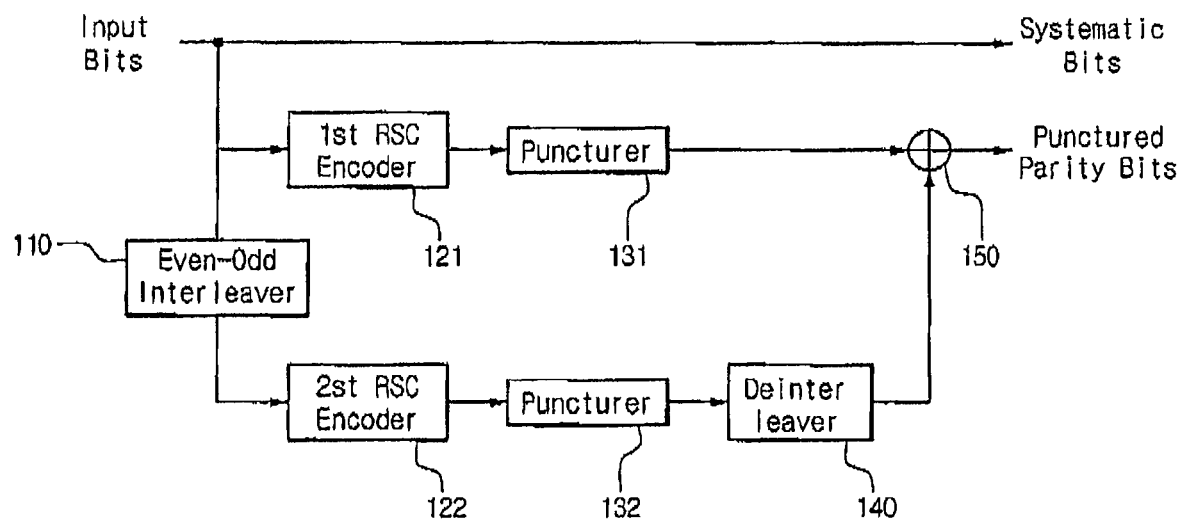
FIG. 1 is a block diagram illustrating an encoder of the space-time turbo code with parallel concatenation of two recursive systematic convolutional (RSC) encoders separated by an even-odd interleaver.

Consider a space-time turbo code for two transmit antennas. FIG. 1 is a block diagram illustrating an encoder of the space-time turbo code with parallel concatenation of two recursive systematic convolutional (RSC) encoders 121, 122 separated by an even-odd interleaver. Referring to FIG. 1, the encoder has two outputs: systematic bits and punctured parity bits. The systematic bits are same as input bits and the punctured parity bits are generated from modulo-2 addition 150 of the outputs of the first RSC encoder 121 and the second RSC encoder 122 the codeword of the space-time turbo code is given by equation (1).

$$c_p = \begin{bmatrix} X(D) \\ \delta^e[X(D)G(D)] \oplus \pi^{-1}(\delta^e[X(D)G(D)]) \end{bmatrix} \quad \text{Equation (1)}$$

Where, X(D) is input bits with code length l,
G(D) is the generator polynominal of the RSC encoder,
π(.) is the bit permuter, and
$\delta^e(.)$ denotes puncturing operation which replaces bits in odd position with zero.

Assuming that l is even, let $X^o$ and $X^e$ denote the odd and even information bit vectors with length l/2, respectively.

The odd and even generator matrices are given by equation (2) and (3).

$$G^o = \begin{bmatrix} g_0 & g_2 & \cdots & g_{l-2} \\ 0 & g_0 & \cdots & g_{l-4} \\ \vdots & \vdots & \ddots & \vdots \\ 0 & \cdots & 0 & g_0 \end{bmatrix} \quad \text{Equation (2)}$$

and $$G^e = \begin{bmatrix} g_1 & g_3 & \cdots & g_{l-1} \\ 0 & g_1 & \cdots & g_{l-3} \\ \vdots & \vdots & \ddots & \vdots \\ 0 & \cdots & 0 & g_1 \end{bmatrix} \quad \text{Equation (3)}$$

Where, $g_i$ (i=0, 1, . . . , l-1) is the $i_{th}$ coefficient of G(D).

Since the column permutation of the codeword matrix does not change its rank property, the column permutated codeword of a space-time turbo is given by equation (4).

$$c_v = \begin{bmatrix} X^e I & X^o P^o \\ X^e G^o \oplus X^o G^e & X^o P^o G^o \oplus X^e P^e G^e \end{bmatrix} \quad \text{Equation (4)}$$

Where, $P^o$ and $P^e$ are the odd and even permutation matrices corresponding to permutation of odd and even bits by π(.), respectively.

To become full rank, the codeword matrix in equation (4) must meet the following sufficient condition given by equation (5).

$$(X^e \oplus X^o P^o)(I \oplus G^o) \oplus (X^e P^e \oplus X^o)G^e \neq 0 \quad \text{Equation (5)}$$

Where, $X^o$ and $X^e$ are not both zero.

However, the space-time turbo code with the codeword matrix in equation (4) does not achieve full antenna diversity because of puncturing and suboptimal decoding, which degrades its performance. To achieve full antenna diversity, rotated construction was proposed for the space-time turbo code with rotated construction is given by equation (6).

$$c_v = \begin{bmatrix} X^e I & X^o P^o G^o \oplus X^e P^e G^e \\ X^e G^o \oplus X^o G^e & X^o P^o \end{bmatrix} \quad \text{Equation (6)}$$

It is known by simulation that antenna diversity can be achieved by using rotated construction.

The space-time turbo code using quantized feedback with two transmit antennas is described as follows.

The performance of an orthogonal space-time block code with two transmit antennas is improved by using a diagonal weighting scheme. In the diagonal weighting scheme, the transmitter adjusts transmit power by weighting two antennas with $|a|^2$ and $1-|a|^2$, respectively, where a is the weighting factor.

Figure 2:
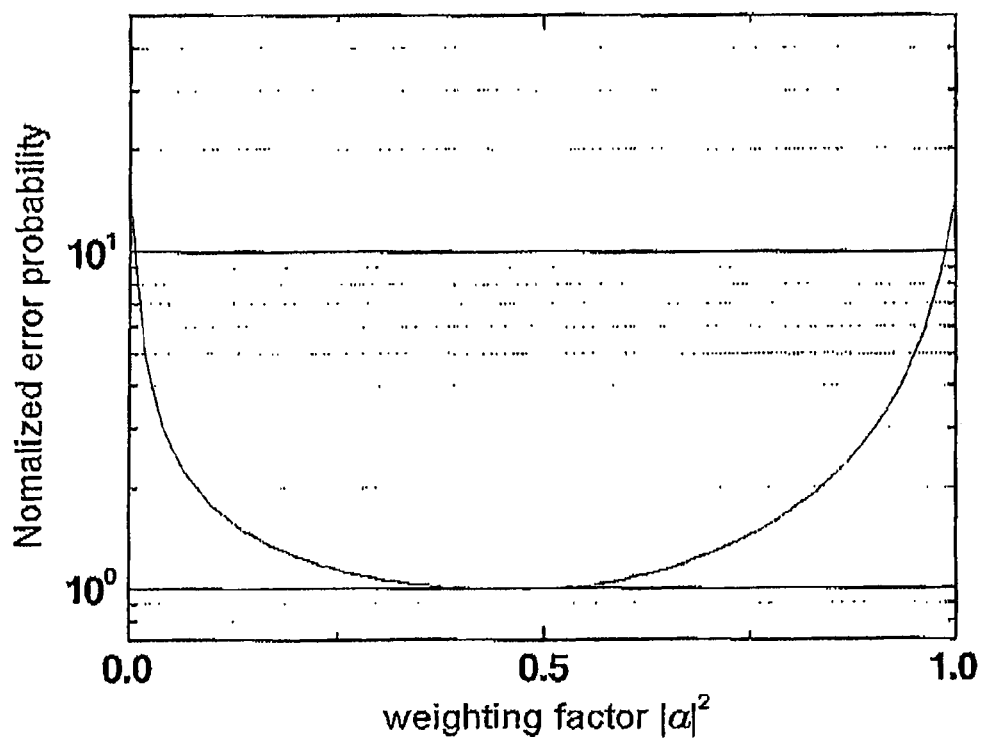
FIG. 2 is a diagram illustrating a normalized BER of the space-time turbo code with the diagonal weighting scheme.

FIG. 2 is a diagram illustrating a normalized BER of the space-time turbo code with the diagonal weighting scheme.

Referring to FIG. 2, It is shown that the space-time turbo code with the diagonal weighting scheme has the lowest BER at $|a|^2=0.5$. The space-time turbo code with weights of $|a|^2=1-|a|^2=0.5$ is same as the original space-time turbo code with unweighted transmit power. Hence, the diagonal weighting scheme does not improve the performance of the space-time turbo code.

To improve its performance by using quantized feedback information, we propose new feedback schemes: antenna altering (AA), quantized phase feedback (QPF), and combined AA and QPF.

Hereinafter, Antenna Altering (AA) will be described in detail.

Consider a state transition from state s to state s' at symbol time t in the component decoder. For the received signal $y_t$ at symbol time t, the branch metric of the transition (s, s') is given by equation (7).

$$\gamma_t(y_t, s, s') = \sum_{p_t} P(y_t | s, s', p_t) P(p_t | s, s') P(s' | s) \quad \text{Equation (7)}$$

Where, Pt denotes the parity bit.

Assume that $c_t=a$ and $p_t=b$ are the systematic and parity bits corresponding to the transition (s, s') at symbol time t, respectively. As the puncturer 131, 132 in FIG. 1 replaces bits of odd position with zeros, the parity bits generated by the first RSC encoder 121 are not included in the received symbols at odd symbol time. Then, the parity bit at odd symbol time is independent of the state transition (s, s'). the branch metric at even and odd symbol time are given by equation (8a) and equation (8b) respectively.

$$\gamma_t(y_t,s,s')=P(y_t|c_t=a,p_t=b)P(c_t=a), t=\text{even} \quad \text{Equation (8a)}$$

and $$\gamma_t(y_t, s, s') = \frac{1}{2} \sum_{p_t \in [-1,1]} P(y_t | c_t = a, p_t) P(c_t = a), \quad \text{Equation (8b)}$$
$$t = \text{odd}$$

From equation (8a) and (8b), the probability of the systematic bit is involved in computing the branch metric at every symbol time while that of the parity bit is involved in it at even symbol time. Thus, the reliability of systematic bits is more important than that of parity bits in decoding of the space-time turbo code. If systematic bits are transmitted through the antenna with smaller channel gain, the performance of the space-time turbo code degrades.

To mitigate the performance degradation, we propose an antenna altering (AA) scheme. The AA scheme always transmits the systematic bits through the antenna with larger channel gain according to matrix with the AA scheme is given by equation (9).

$$c_v = \begin{cases} \begin{bmatrix} X^e I & X^o P^o \\ X^e G^o \oplus X^o G^e & X^o P^o G^o \oplus X^e P^e G^e \end{bmatrix}, & \text{if } |\alpha_1| \geq |\alpha_2| \\ \begin{bmatrix} X^e G^o \oplus X^o G^e & X^o P^o G^o \oplus X^e P^e G^e \\ X^e I & X^o P^o \end{bmatrix}, & \text{otherwise} \end{cases} \quad \text{Equation (9)}$$

Where $\alpha_i$ is the complex channel gain from the $i_{th}$ transmit antenna to the receive antenna.

Figure 3:
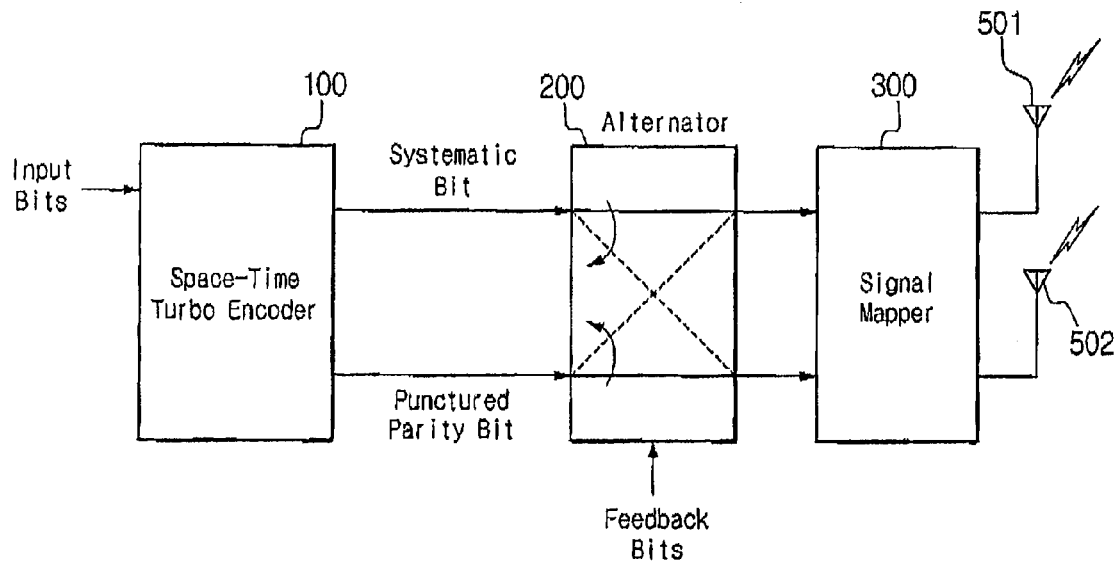
FIG. 3 is a diagram illustrating a transmitter of the space-time turbo code with an antenna altering scheme.

Referring to FIG. 3, the transmitter comprise a space-time turbo encoder 100 encoding input bits corresponding to a message with space-time turbo code and generating a systematic bit and a punctured parity bit; and an alternator 200 selecting one of the two antennas 501 and 502 for the systematic bit and the punctured parity bit and transmitting the systematic bit and the punctured parity bit respectively through the corresponding selected antenna.

The alternator 200 selects a transmit antenna with larger channel gain of the two transmit antennas 501 and 502 and transmits the systematic bit through the selected antenna.

For example, in case $|\alpha_1| > |\alpha_2|$, the feedback bit "0" is transmitted to transmitting terminal from receive terminal. The systematic bit is transmitted through the first transmit antenna 501 and the punctured parity bit is transmitted through the second transmit antenna 502.

On the contrary, in case $|\alpha_1| > |\alpha_2|$, the feedback bit "1" is transmitted to transmitting terminal from receive terminal. The systematic bit is transmitted through the second transmit antenna 502 and the punctured parity bit is transmitted through the second transmit antenna 501. Where $\alpha_1$ is the complex channel gain from the $i_{th}$ transmit antenna to the receive antenna.

Table 1 shows an example of feedback bit reflecting the information of the channel gain.

TABLE 1

| Comparison of channel gain | Feedback bit |
|---|---|
| $|\alpha_1| \geqq |\alpha_2|$ | 0 |
| $|\alpha_1| < |\alpha_2|$ | 1 |

After selecting the transmit antenna for the systematic bit and the punctured parity bit, the systematic bit and the punctured parity bit is mapping to corresponding constellation according to an signal mapper 300 and transmit through the antennas 501 and 502.

Figure 4:
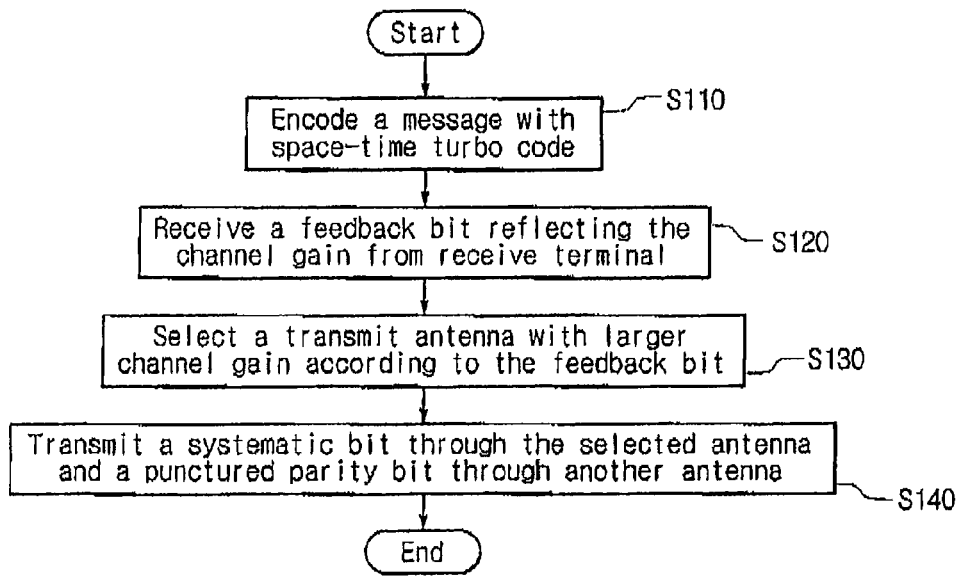
FIG. 4 is a flow chart encoding the space-time turbo code with the antenna altering scheme.

FIG. 4 is a flow chart of method of encoding the space-time turbo code with the antenna altering scheme.

Referring to FIG. 4, at step S110, encoding a message for communication with space-time turbo code and generating a systematic bit and a punctured parity bit. At step S120, receiving a feedback bit reflecting the information of the channel gain of a plurality of transmit antennas from receive antenna. At step S130, selecting a transmit antenna with larger channel gain of the plurality of transmit antennas according to the feedback bit. At step S140, transmitting the systematic bit through the selected antenna and transmitting the punctured parity bit through another antenna.

Hereinafter, Quantized Phase Feedback (QPF) will be described in detail.

Figure 5:
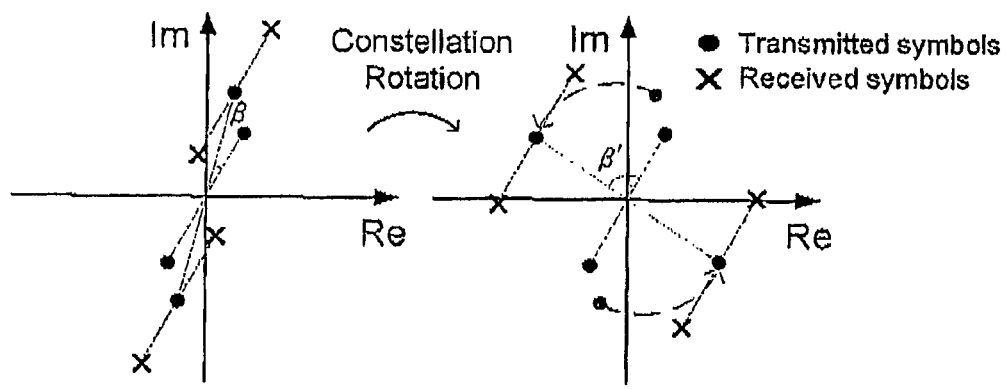
FIG. 5 is a diagram illustrating a constellation of the transmitted and received symbols in a noiseless fading channel.

FIG. 5 is a diagram illustrating a constellation of the transmitted and received symbols in a noiseless fading channel.

Referring to FIG. 5, where β and β' are angles between transmitted signals and between rotated signals, respectively. It is shown that the minimum Euclidean distance between the received symbols increases by rotating the constellation. The performance of the space-time turbo code is improved by applying the constellation rotation to the transmit signals.

Consider the QPF scheme with feedback index $n \in \{0, 1, 2, \ldots, 2^{k-1}\}$ where k is the number of feedback bits. Suppose that the transmitter rotates the symbols of $i_{th}$ transmit antenna by a rotation angle $\theta_i(n)$. Then, the received signal at symbol time t is given by equation (10)

$$y_t = \sqrt{E_S} \sum_{i=1}^{2} \alpha_i e^{j\theta_i(n)} c_t^i + \eta_t \quad \text{Equation (10)}$$

Where $E_s$ is the symbol energy, $\alpha_i$ is the complex channel gain for the $i_{th}$ transmit antenna, $c_t^i$ is the transmitted symbol of the $i_{th}$ antenna at symbol time t, and $\eta_t$ is an independent and identically distributed complex Gaussian noise with zero mean and variance of $N_0/2$ per dimension.

Assume that the receiver decides in favor of the erroneous codeword $e = e_1^1 e_1^2 e_2^1 e_2^2 \ldots e_t^1 e_t^2$ when codedword $c = c_1^1 c_1^2 c_2^1 c_2^2 \ldots c_t^1 c_t^2$ is transmitted. If perfect CSI is available at the receiver, conditional pairwise error probability given $\alpha_1$ and $\alpha_1$ is bounded as equation (11).

$$P(c \to e | \alpha_1, \alpha_2) \leqq \exp(-d^2(c,e) E_S/4N_0) \quad \text{Equation (11)}$$

Where, $$d^2(c, e) = \sum_{i=1}^{l} \left| \sum_{i=1}^{2} \alpha_i e^{j\theta_i(n)} (c_t^i + e_t^i) \right|^2$$

is the squared Euclidian distance between c and e.

After some derivation, the squared Euclidian distance is given by equation (12).

$$d^2(c,e) = \begin{bmatrix} \alpha_1 e^{j\theta_1(n)} & \alpha_2 e^{j\theta_2(n)} \end{bmatrix} \begin{bmatrix} A_{11} & A_{12} \\ A_{21} & A_{22} \end{bmatrix} \quad \text{Equation (12)}$$

$$\begin{bmatrix} \alpha_1^* e^{-j\theta_1(n)} \\ \alpha_2^* e^{-j\theta_2(n)} \end{bmatrix}$$

$$= |\alpha_1|^2 A_{11} + |\alpha_2|^2 A_{22} + 2|\alpha_1||\alpha_2||A_{12}|$$

$$\cos(\angle A_{12} + \angle \alpha_1 - \angle \alpha_2 + \theta_1(n) - \theta_2(n))$$

Where, $$A_{ij} = \sum_{t=1}^{l} (c_t^i - e_t^i)(c_t^j - e_t^j)^*$$

and ∠. denotes the phase of the complex value.

From equation (11) and (12), conditional pairwise error probability given given $\alpha_1$ and $\alpha_1$ is bounded as equation (13).

$$P(c \to e \mid \alpha_1, \alpha_2) \leq \quad \text{Equation (13)}$$

$$\exp\left(-\frac{E_S}{4N_0}(|\alpha_1|^2 A_{11} + |\alpha_2|^2 A_{22} + 1|\alpha_1||\alpha_2| \right.$$

$$|A_{12}|\cos(\angle A_{12} + \phi + \Delta\theta(n))))$$

Where, $\phi = \angle\alpha_1 - \angle\alpha_2$ is the phase difference between the channel gains and $\Delta\theta(n) = \theta_1(n) - \theta_2(n)$ is the difference between the rotation angles.

Let, $S_0, S_1, \ldots, S_{2^k-1}$ denote disjoint subsets of the region $[0, 2\pi]$ whose union is the region $[0, 2\pi]$. When the phase difference $\phi$ falls in a subset $S_n$, the receiver feeds-back the index n to the transmitter so that the rotation angle is decide as $\Delta\theta(n)$. By integrating equation (13) over the subsets $S_n$, n=0, 1, 2, ..., $2^k-1$, conditional pairwise error probability given $|\alpha_1|$ and $|\alpha_1|$ is bounded as equation (14).

$$P(c \to e \mid |\alpha_1|, |\alpha_2|) \leq \quad \text{Equation (14)}$$

$$\sum_{n=0}^{2^k-1} \left[ \frac{1}{2\pi} \int_{\phi \in S_n} \exp\left(-\frac{E_S}{4N_0}(|\alpha_1|^2 A_{11} + |\alpha_2|^2 A_{22} + \right.\right.$$

$$2|\alpha_1||\alpha_2||A_{12}|\cos(\angle A_{12} + \phi + \Delta\theta(n))) \bigg) d\phi \bigg]$$

By expanding the exponential term in equation (14) into a Taylor series, $\Delta\theta(n)$ and $S_n$, n=0, 1, 2, ..., $2^k-1$, minimizing conditional pairwise error probability are obtained as equation (15).

$$(\Delta\theta(0), \cdots, \Delta\theta(2^k-1), S_0, \cdots, S_{2^k-1}) = \quad \text{Equation (15)}$$

$$\arg \min_{\Delta\theta(n), S_n} \sum_{k=0}^{\infty} \frac{B^{2k}}{2\pi(2k)!}$$

$$\left[ \sum_{n=0}^{2^k-1} \left( \int_{S_n} \cos^{2k}(\angle A_{12} + \phi + \Delta\theta(n)) d\phi \right) \right]$$

Where, $B = -E_S|\alpha_1||\alpha_2||A_{12}|/2N_0$.

For simplicity, the rotation angle $\theta_1(n)$ and $\theta_2(n)$ are set to $\Delta\theta(n)$ and zero, respectively.

In case that the BPSK space-time turbo code adopts 1-bit feedback, the feedback index n is set to 0 and 1 when the phase difference $\phi$ falls in subset $S_0$ and $S_1$, respectively.

Then, the optimal rotation angle and disjoint subsets minimizing conditional pairwise error probability are obtained as equation (16).

$$(\Delta\theta(0), \Delta\theta(1), S_0, S_1) = \arg \quad \text{Equation (16)}$$

$$\min_{\Delta\theta(0),\Delta\theta(1),S_0,S_1} \sum_{k=0}^{\infty} \frac{B^{2k}}{2\pi(2k)!} \left[ \int_{S_0} \cos^{2k}(\angle A_{12} + \phi + \Delta\theta(0)) \right.$$

$$\left. d\phi + \int_{S_1} \cos^{2k}(\angle A_{12} + \phi + \Delta\theta(1)) d\phi \right]$$

For BPSK, $A_{12}$ is real and the optimal rotation angles become $\Delta\theta(0)=\pi/2$ and $\Delta\theta(1)=0$, and the disjoint subsets become $S_1=[\pi/4, 3\pi/4] \cup [5\pi/4, 7\pi/4]$ and $S_2=S_1^c$ where C denotes the complement set operation.

In case of the QPSK space-time turbo code, it is difficult to find the optimal solution of equation (15) as $\angle A_{12}$ depends on $\phi$. From the fact that the optimal rotation angles in case of BPSK maximizes the angle between rotated signals $\beta'$, we heuristically obtain the rotation angles and disjoint subsets for maximum value of $\beta'$.

Table 2 shows the feedback index and the difference of the rotation angles corresponding to disjoint subset $S_n$ for both BPSK and QPSK.

TABLE 2

| Modulation | Disjoint subset $S_n$ | Feedback Index n | Rotation angle $\Delta\theta(n)$ |
|---|---|---|---|
| BPSK | $[0, \frac{\pi}{4}] \cup [\frac{3\pi}{4}, \frac{5\pi}{4}] \cup [\frac{7\pi}{4}, 2\pi]$ | 0 | $0.5\pi$ |
|  | $[\frac{\pi}{4}, \frac{3\pi}{4}] \cup [\frac{5\pi}{4}, \frac{7\pi}{4}]$ | 1 | 0 |
| QPSK | $[0, \frac{\pi}{8}] \cup [\frac{3\pi}{8}, \frac{5\pi}{8}] \cup [\frac{7\pi}{8}, \frac{9\pi}{8}] \cup [\frac{11\pi}{8}, \frac{13\pi}{8}] \cup [\frac{15\pi}{8}, 2\pi]$ | 0 | $0.25\pi$ |
|  | $[\frac{\pi}{8}, \frac{3\pi}{8}] \cup [\frac{5\pi}{8}, \frac{7\pi}{8}] \cup [\frac{9\pi}{8}, \frac{11\pi}{8}] \cup [\frac{13\pi}{8}, \frac{15\pi}{8}]$ | 1 | 0 |

Figure 6:
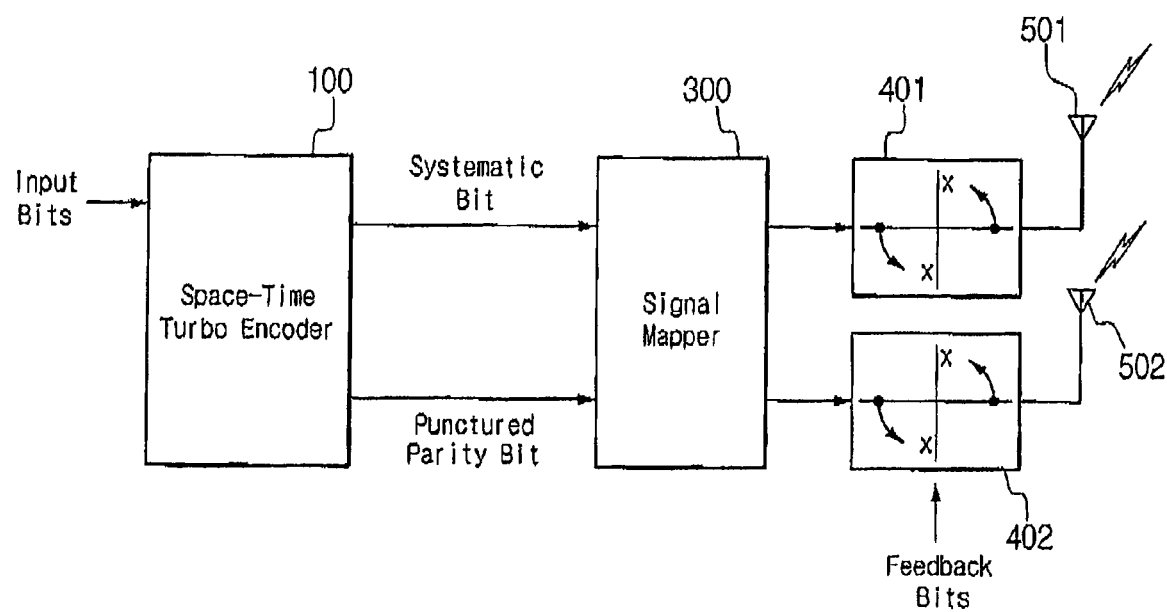
FIG. 6 is a diagram illustrating a transmitter of the space-time turbo code with a quantized phase feedback.

FIG. 6 is a diagram illustrating a transmitter of the space-time turbo code with a quantized phase feedback.

Referring to FIG. 6, the transmitter comprise a space-time turbo encoder 100 encoding input bits corresponding to a message with space-time turbo code and generating a systematic bit and a punctured parity bit; and a phase rotator 401 and 402 rotating the constellation corresponding to the systematic bit and the punctured parity bit, respectively.

The constellation corresponding to the systematic bit and the punctured parity bit by signal mapper 300 is decided. The phase rotator 401 and 402 rotate the constellation so that phase difference between the channel gains of the two transmit antennas 501 and 502, as shown above table 2, through feedback bit being transmitted from the receive antenna is largest. The rotated symbol is transmitted through antennas 501 and 502.

Figure 7:
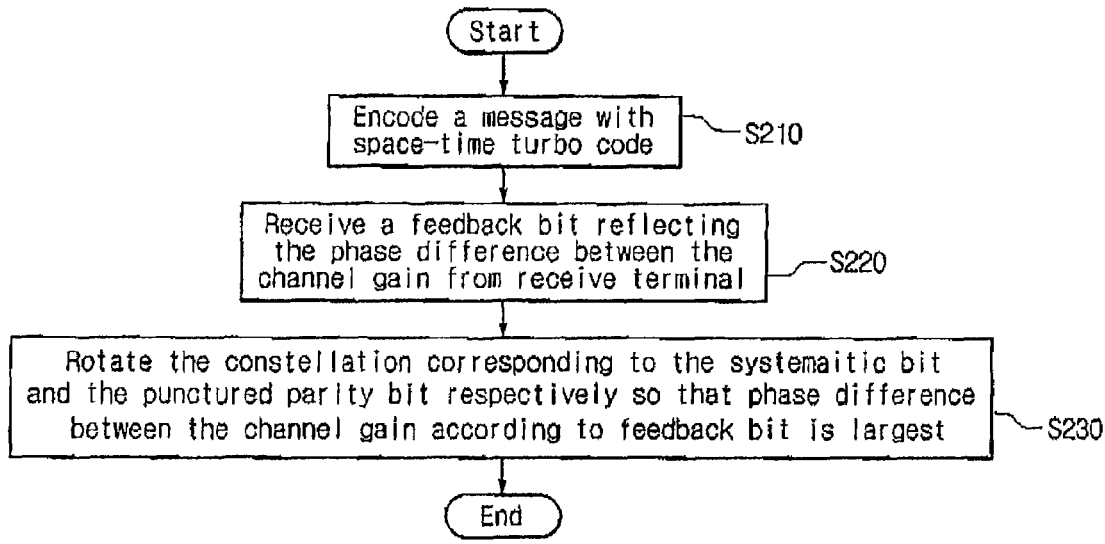
FIG. 7 is a flow chart encoding the space-time turbo code with the quantized phase feedback.

FIG. 7 is a flow chart encoding the space-time turbo code with the quantized phase feedback.

Referring to FIG. 7, at step S210, encoding a message for communication with space-time turbo code and generating a systematic bit and a punctured parity bit. At step S220, receiving a feedback bit reflecting the phase difference information of the channel gain of a plurality of transmit antennas from a receive antenna. At step S230, rotating the constellation corresponding to the systematic bit and the punctured parity bit, respectively, so that phase difference between the channel gains according to feedback bit is largest.

The proposed AA and QPF schemes obtain the independent performance gains from the feedback information of the channel gain and phase, respectively. To improve the performance further with the feedback information of both the channel gain and phase, we combine the AA scheme with the QPF scheme.

Figure 8:
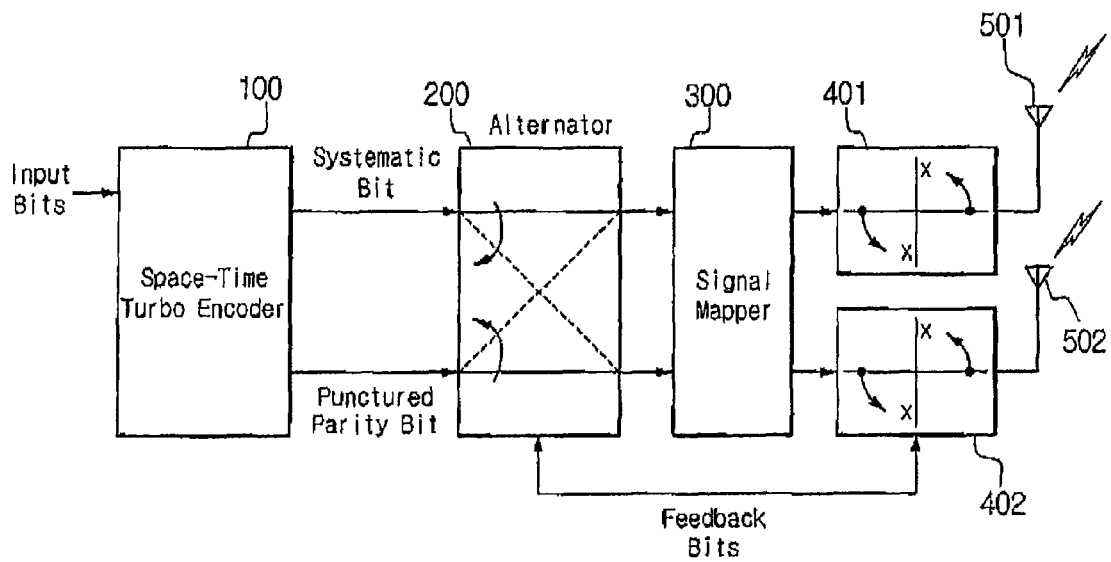
FIG. 8 is a diagram illustrating a transmitter of the space-time turbo code with a combined scheme.

FIG. 8 is a diagram illustrating a transmitter of the space-time turbo code with a combined scheme.

Referring to FIG. 8, the transmitter comprise a space-time turbo encoder 100 encoding input bits corresponding to a message with space-time turbo code and generating a systematic bit and a punctured parity bit; an alternator 200 selecting one of the two antennas 501 and 502 for the systematic bit and the punctured parity bit and transmitting the systematic bit and the punctured parity bit respectively through selected antenna; and a phase rotator 401 and 402 rotating the constellation corresponding to the systematic bit and the punctured parity bit, respectively.

The alternator 200 selects the transmit antenna with larger channel gain of the two transmit antennas 501 and 502 through the first feedback bit being transmitted from a receive antenna and transmits the systematic bit through the selected antenna.

The phase rotator 401 rotates the constellation so that the channel gain phase difference between the transmit antennas 501 and 502 through the second feedback bit which is transmitted from the receive antenna becomes largest.

The transmit antennas are altered so that the feedback bits are always transmitted through the transmit antenna with larger channel gain. Then, after signal mapping, the signal of each antenna is rotated the constellation according to the feedback information of the channel phase. For example, if both the AA and QPF schemes use the feedback information of 1 bit, the combined scheme needs that of 2 bits.

Hereinafter, simulation results will be described in detail.

The performance of the proposed feedback schemes is evaluated for the space-time turbo code with two transmit antennas and one receive antenna in a quasi-static Rayleigh fading channel. Assume that perfect CSI is available at both the RSC encoders for the BPSK and QPSK space-time turbo code are given by $g_b(D)=(1+D^2)/(1+D+D^2)$ and $g_q(D)=(1+2D+2D^2)/(1+3D+2D^2+2D^3)$ respectively. The codelength/is 1024 and the number of iterations is 4. The space-time turbo code with AA and QPF schemes adopts the feedback information of 1 bit as in Table 1 and Table 2. The transmit antenna is selected (AA scheme) or the constellation is rotated (QPF scheme) according to feedback bit per one frame (Codelength is 1024).

Figure 9:
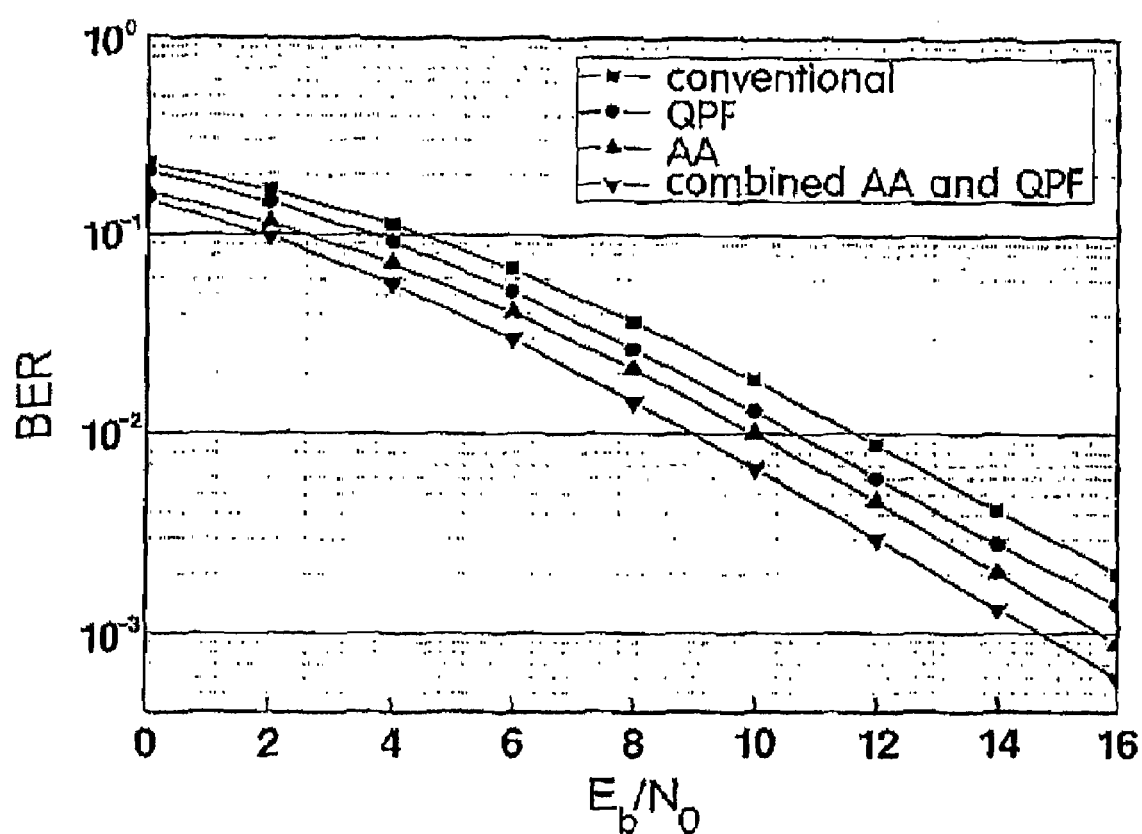
FIG. 9 is a graph illustrating a performance of the BPSK space-time turbo codes with feedback scheme in accordance with an exemplary embodiment of the present invention in a quasi-static Rayleigh fading.

FIG. 9 is a graph illustrating a performance of the BPSK space-time turbo codes with feedback scheme in accordance with an exemplary embodiment of the present invention in a quasi-static Rayleigh fading.

Referring to FIG. 9, the space-time turbo codes with the proposed AA, QPF and combined schemes have the SNR gains of about 1.2 dB, 2 dB and 3 dB, respectively, over the conventional space-time turbo code at BER of $10^{-2}$. The AA scheme has lower BER than the QPF scheme as the minimum Euclidian distance by rotating constellation does not significantly increase for BPSK.

FIG. 10 is a graph illustrating a performance of the QPSK space-time turbo codes with feedback scheme in accordance with an exemplary embodiment of the present invention in a quasi-static Rayleigh fading.

Referring to FIG. 10, the proposed schemes have still better performance than the conventional scheme for QPSK. However, the QPF scheme out performs the AA scheme at relatively high SNR. It is because the gain of antenna altering decreases as SNR increases.

The AA scheme improves the reliability of the systematic bits by altering the antennas according to the feedback information of the channel gain. The QPF scheme increases the minimum Euclidian distance by rotating the constellation according to the feedback information of the channel phase. From simulation results, the AA and QPF schemes have better performance than the conventional scheme and the combined scheme achieves the SNR gains of up 3 dB and 2 dB at BER 10-2 for BPSK and QPSK, respectively. Thus, the AA and QPF of the present invention have better performance than the conventional scheme.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An apparatus for transmission encoding a message with space-time turbo code in digital mobile communication system having a plurality of transmit antennas, comprising:
   a space-time turbo encoder encoding an input bit corresponding to the message with a space-time turbo code and generating a systematic bit and a punctured parity bit; and
   a phase rotator rotating a constellation corresponding to the systematic bit and the punctured parity bit, respectively, wherein the phase rotator rotates the constellation according to a feedback bit from a receive antenna so that phase difference between the channel gains of the plurality of transmit antennas would be at its largest.

2. The apparatus for transmission of claim 1, wherein the number of the transmit antennas in the digital mobile communication system is two.

3. A method for transmission encoding a message with space-time turbo code in digital mobile communication system having a plurality of transmit antennas, comprising:
   encoding the message for communication with space-time turbo code and generating a systematic bit and a punctured parity bit;
   receiving a feedback bit reflecting a phase difference information of the channel gain between the plurality of transmit antennas from a receive antenna; and
   rotating a constellation corresponding to the systematic bit and the punctured parity bit, respectively, according to a feedback bit so that the phase difference between the channel gains of the plurality of transmit antennas would be at its largest.

4. The method for transmission of claim 3, wherein the number of the transmit antennas in the digital mobile communication system is two.

5. An apparatus for transmission encoding a message with space-time turbo code in digital mobile communication system having a plurality of transmit antennas, comprising:
   a space-time turbo encoder encoding an input bit corresponding to the message with a space-time turbo code and generating a systematic bit and a punctured parity bit; and
   an alternator selecting one of the plurality of transmit antennas for each of the systematic bit and the punctured parity bit; and
   a phase rotator rotating a constellation corresponding to the systematic bit and the punctured parity bit, respectively, wherein the alternator selects a transmit antenna with larger channel gain of the plurality of transmit antennas according to a first feedback bit being transmitted from a receive antenna and transmits the systematic bit corresponding to the rotated constellation through the selected transmit antenna, and wherein the phase rotator rotates the constellation according to a second feedback bit from a receive antenna so that phase difference between the channel gains of the plurality of transmit antennas is at its largest.

6. The apparatus for transmission of claim 5, wherein the number of the transmit antennas in the digital mobile communication system is two.

7. A method for transmission encoding a message with space-time turbo code in digital mobile communication system having a plurality of transmit antennas, comprising:

encoding an input bit corresponding to the message for communication with space-time turbo code and generating a systematic bit and a punctured parity bit;

receiving a first feedback bit reflecting information about the channel gain of the plurality of transmit antennas from a receive antenna;

selecting a transmit antenna with the largest channel gain from the plurality of transmit antennas according to the first feedback bit;

receiving a second feedback bit reflecting a phase difference information of the channel gain between of the plurality of transmit antennas from a receive antenna;

rotating a constellation corresponding to the systematic bit and the punctured parity bit, respectively, according to the second feedback bit so that the phase difference between the channel gains of the plurality of transmit antennas is at its largest; and transmitting the systematic bit and the punctured parity bit corresponding to the rotated constellation through the selected transmit antenna and one of the other antennas, respectively.

8. The method for transmission of claim 7, wherein the number of the transmit antennas in the digital mobile communication system is two.

* * * * *